United States Patent
Hu et al.

(10) Patent No.: US 10,482,940 B2
(45) Date of Patent: Nov. 19, 2019

(54) COMPUTATIONAL ACCURACY IN A CROSSBAR ARRAY

(71) Applicant: HEWLETT PACKARD ENTERPRISE DEVELOPMENT LP, Houston, TX (US)

(72) Inventors: Miao Hu, Palo Alto, CA (US); John Paul Strachan, Palo Alto, CA (US); Zhiyong Li, Palo Alto, CA (US); Stanley Williams, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 16/062,578

(22) PCT Filed: Dec. 17, 2015

(86) PCT No.: PCT/US2015/066371
§ 371 (c)(1),
(2) Date: Jun. 14, 2018

(87) PCT Pub. No.: WO2017/105460
PCT Pub. Date: Jun. 22, 2017

(65) Prior Publication Data
US 2019/0189174 A1    Jun. 20, 2019

(51) Int. Cl.
*G11C 11/00* (2006.01)
*G11C 11/16* (2006.01)
*G11C 13/00* (2006.01)

(52) U.S. Cl.
CPC ...... *G11C 11/1659* (2013.01); *G11C 11/1677* (2013.01); *G11C 13/0002* (2013.01);
(Continued)

(58) Field of Classification Search
CPC ............ G11C 11/1659; G11C 11/1677; G11C 13/003; G11C 13/004; G11C 13/0064; G11C 2213/71; G11C 2213/77
(Continued)

(56) References Cited

U.S. PATENT DOCUMENTS 8,190,921 B1    5/2012   Harwood
8,856,055 B2    10/2014  Brezzo et al.
(Continued)

OTHER PUBLICATIONS

Alvaro Velasquez., "Parallel Computing Using Memristive Crossbar Networks: Nullifying The Processor-Memory Bottleneck", Nov. 29, 2014, www.sumitkumarjha.com/files/idt.pdf.
(Continued)

*Primary Examiner* — Viet Q Nguyen
(74) *Attorney, Agent, or Firm* — Hewlett Packard Enterprise Patent Department (57) ABSTRACT

Example implementations of the present disclosure relate to improved computational accuracy in a crossbar array. An example system may include a crossbar array, having a plurality of memory elements at junctions, usable in performance of computations. The example system may further include a calculate engine to calculate ideal conductance of memory elements at a plurality of junctions of the crossbar array and a determine engine to determine conductance of the memory elements at the plurality of junctions of the crossbar array. An adjust engine of the example system may be used to adjust conductance of at least one memory element to improve computational accuracy by reduction of a difference between the ideal conductance and the determined conductance of the at least one memory element.

12 Claims, 8 Drawing Sheets

(52) U.S. Cl.
CPC .......... *G11C 13/003* (2013.01); *G11C 13/004* (2013.01); *G11C 13/0064* (2013.01); *G11C 2213/71* (2013.01); *G11C 2213/77* (2013.01)

(58) Field of Classification Search
USPC ........................................................ 365/148
See application file for complete search history.

(56) References Cited

U.S. PATENT DOCUMENTS

| | | | |
|---|---|---|---|
| 9,152,827 B2 | 10/2015 | Linderman et al. | |
| 9,336,870 B1* | 5/2016 | Mickel ................ | G11C 13/0011 |
| 9,633,724 B2* | 4/2017 | Jo ........................ | G11C 29/026 |
| 9,659,249 B1* | 5/2017 | Copel .................. | G06N 3/0635 |
| 9,785,615 B1* | 10/2017 | Merced Grafals ...... | G06F 17/16 |
| 9,805,770 B1* | 10/2017 | Merced Grafals ... | G11C 13/004 |
| 9,847,124 B2* | 12/2017 | Hu ......................... | G06G 7/122 |
| 2003/0093684 A1 | 5/2003 | Kaiserswerth | |
| 2007/0233761 A1 | 10/2007 | Mouttet | |
| 2008/0089110 A1* | 4/2008 | Robinett ................ | B82Y 10/00 |
| | | | 365/148 |
| 2008/0237886 A1* | 10/2008 | Wu ........................ | B82Y 10/00 |
| | | | 257/776 |
| 2009/0138709 A1 | 5/2009 | Ekkizogloy | |
| 2009/0222675 A1 | 9/2009 | Lange | |
| 2010/0102290 A1 | 4/2010 | Lu et al. | |
| 2011/0188282 A1 | 8/2011 | Chevallier et al. | |
| 2012/0166169 A1 | 6/2012 | Lu | |
| 2013/0346793 A1 | 12/2013 | Flynn | |
| 2014/0112055 A1* | 4/2014 | Kawahara ............. | G11C 13/00 |
| | | | 365/148 |
| 2014/0133211 A1 | 5/2014 | Nazarian et al. | |
| 2015/0029780 A1 | 1/2015 | Rinerson et al. | |
| 2017/0178725 A1* | 6/2017 | Yang .................... | G11C 13/003 |
| 2017/0316828 A1* | 11/2017 | Hu ....................... | G11C 13/0026 |
| 2018/0108403 A1* | 4/2018 | Ge ........................... | G11C 7/04 |
| 2018/0253642 A1* | 9/2018 | Gokmen ................ | G06N 3/084 |
| 2018/0301189 A1* | 10/2018 | Hu ....................... | G11C 13/0002 |
| 2018/0350433 A1* | 12/2018 | Hu ........................... | G06G 7/16 |
| 2018/0364785 A1* | 12/2018 | Hu ........................ | G06F 1/3206 |
| 2019/0066780 A1* | 2/2019 | Hu ........................... | G11C 11/56 |

OTHER PUBLICATIONS

International Searching Authority, The International Search Report and the Written Opinion, PCT/US2015/066371, Aug. 27, 2016, 11 Pgs.

Omid K. et al., "An Analytical Approach for Memristive Nanoarchitectures", < http://arxiv.org/pdf/1106.2927.pdf > (Research Paper), Oct. 29, 2011, 12 pages.

* cited by examiner

COMPUTATIONAL ACCURACY IN A CROSSBAR ARRAY

BACKGROUND

A crossbar array may be inherently efficient for parallel signal processing because of a compact integrated structure. For example, an ideal crossbar structure may be used to accurately perform, via Kirchhoff's Current Law, vector-matrix multiplication between input vectors and data values (weights) stored by memory elements in a matrix of the crossbar array.

DETAILED DESCRIPTION

Computations using real crossbar circuits (arrays) may have notable computational inaccuracy (errors) relative to target results, such as results determined from input of test data with known correct output and/or results obtained from a simulated (ideal) crossbar array, etc. Such computational inaccuracy may be caused by behavior of the actual crossbar array being affected by, for example, increasing wire resistance that may correlate with distance of a column from an input signal in a row, resistance for signal input and/or output, inherent device nonlinearity, thermal effects, noise, and/or other parasitics, etc. Such influences on behavior of an actual crossbar array may be difficult to compensate for during the computations and/or data processing. As such, the present disclosure relates to improved computational accuracy in a crossbar array.

An example system may include a crossbar array, having a plurality of memory elements at junctions, usable in performance of computations. The example system may further include a calculate engine to calculate ideal conductance of memory elements at a plurality of junctions of the crossbar array and a determine engine to determine conductance of the memory elements at the plurality of junctions of the crossbar array. An adjust engine of the example system may be used to adjust conductance of at least one memory element to improve computational accuracy by reduction of a difference between the ideal conductance and the determined conductance of the at least one memory element.

Figure 1:
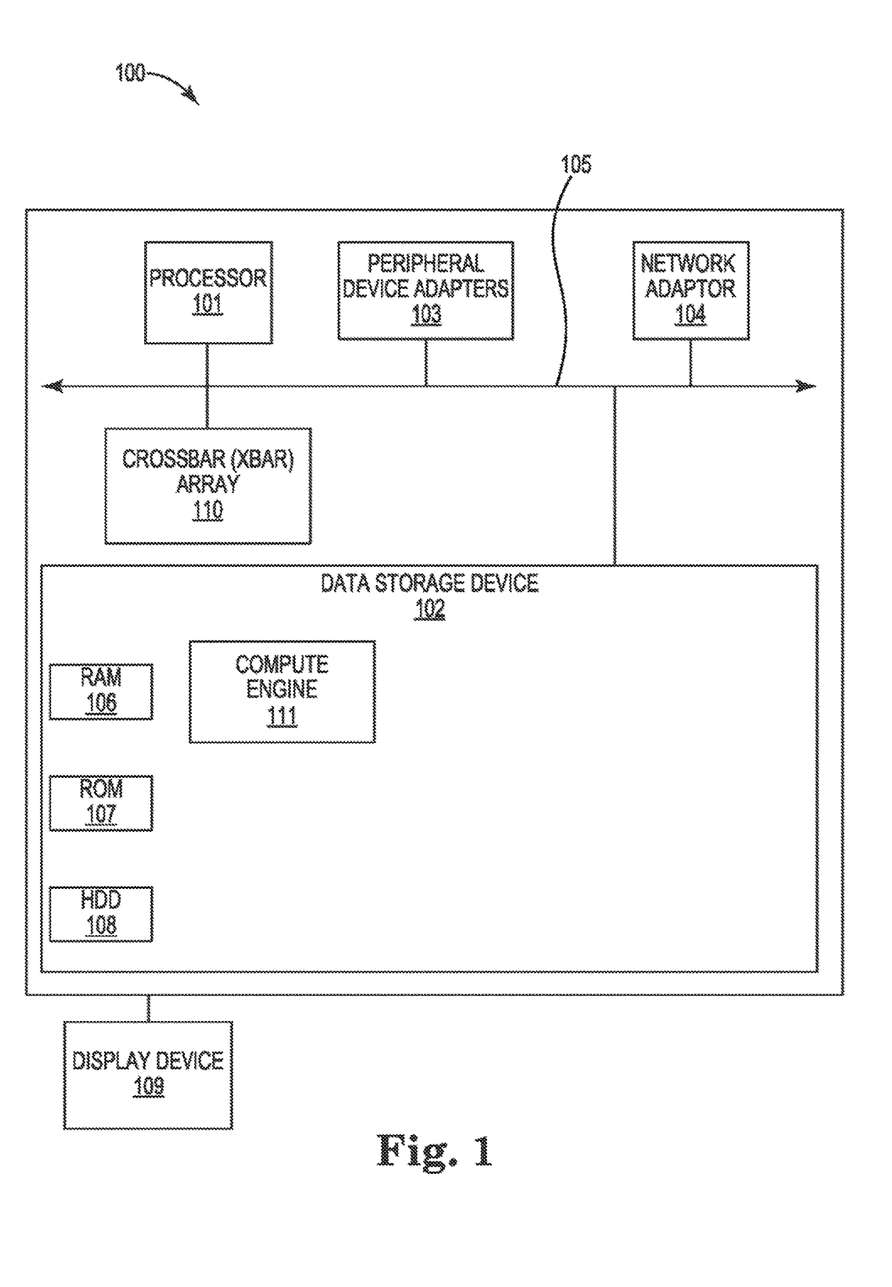
FIG. 1 illustrates a diagram of an example of a computing system for improved computational accuracy in a crossbar array according to the present disclosure.

FIG. 1 illustrates a diagram of an example of a computing system for improved computational accuracy in a crossbar array according to the present disclosure. FIG. 1 is a diagram of a computing system 100 for determining a dot product, according to one example of the principles described herein. The computing system 100 may be implemented in an electronic device. Examples of electronic devices include servers, desktop computers, laptop computers, personal digital assistants (PDAs), mobile devices, smartphones, gaming systems, and/or tablets, among other electronic devices.

The computing system 100 may be utilized in any data processing scenario including stand-alone hardware, mobile applications, through a computing network, or combinations thereof. Further, the computing system 100 may be used in a computing network, a public cloud network, a private cloud network, a hybrid cloud network, other forms of networks, or combinations thereof. The systems and methods described herein may be provided by the computing system 100 are provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The systems present herein may be implemented on one or multiple hardware platforms, in which the modules in the system may be executed on one or across multiple platforms. Such modules may run on various forms of cloud technologies and hybrid cloud technologies or be offered as a SaaS (Software as a service) that may be implemented on or off the cloud. In another example, the methods provided by the computing system 100 may be executed by a local administrator.

To achieve its intended functionality, the computing system 100 may include various hardware components. Among these hardware components may be a number of processors 101, a number of data storage devices 102, a number of peripheral device adapters 103, and/or a number of network adapters 104. These hardware components may be interconnected through use of a number of busses and/or network connections. For example, the processor 101, data storage device 102, peripheral device adapters 103, and/or a network adapter 104 may be communicatively coupled via a bus 105.

The processor 101 may include the hardware architecture to retrieve executable code from the data storage device 102 and execute the executable code. The executable code may, when executed by the processor 101, cause the processor 101 to implement at least the functionality, for example, of applying a number of first voltages to a corresponding number of row lines (wires) within a memristive crossbar array to change the resistive values of a corresponding number of memristors located at junctions between the row wires and a number of column lines (wires), the first voltages representing a corresponding number of values within a matrix, respectively. The executable code may, when executed by the processor 101, also cause the processor 101 to implement at least the functionality of applying a number of second voltages to a corresponding number of row wires within a memristive crossbar array, the second voltages representing a corresponding number of vector values. The executable code may, when executed by the processor 101, further cause the processor 101 to implement at least the functionality of collecting the output currents from the column wires, the collected output currents representing the dot product. In the course of executing code, the processor 101 may receive input from and and/or provide output to a number of the remaining hardware units.

The data storage device 102 may store data such as executable program code that is executable by the processor 101 or other processing device. The data storage device 102 may specifically store computer code representing a number of applications that the processor 101 may execute to implement at least the functionality described herein.

The data storage device 102 may include various types of memory modules, including volatile and nonvolatile memory. For example, the data storage device 102 of the present example includes RAM 106, ROM 107, and/or HDD memory 108. Many other types of memory may also be utilized, and the present disclosure contemplates the use of as many varying type(s) of memory in the data storage device 102 as may suit a particular application of the principles described herein. In various examples, different types of memory in the data storage device 102 may be used for different data storage needs. For example, in certain examples the processor 101 may boot from ROM 107, maintain nonvolatile storage in the HDD memory 108, and/or execute program code stored in RAM 106, among other potential uses of memory types.

The data storage device 102 may include a computer-readable medium, a computer-readable storage medium, and/or a non-transitory computer-readable medium, among others. For example, the data storage device 102 may be, but is not limited to, an electronic, magnetic, optical, electromagnetic, infrared, or semiconductor system, apparatus, or device, or any suitable combination of the foregoing. More specific examples of the computer-readable storage medium may include, for example, the following: an electrical connection having a number of wires, a portable computer diskette, a hard disk, a RAM, a ROM, an erasable programmable ROM (EPROM or Flash memory), a portable compact disc ROM (CD-ROM), an optical storage device, a magnetic storage device, or any suitable combination of the foregoing. In the context of this disclosure, a computer-readable storage medium may be any tangible medium that can contain, or store computer-usable program code for use by or in connection with an instruction execution system, apparatus, or device. In another example, a computer-readable storage medium may be any non-transitory medium that can contain, or store a program for use by or in connection with an instruction execution system, apparatus, or device.

The hardware adapters 103, 104 in the computing system 100 may enable the processor 101 to interface with various other hardware elements, external and internal to the computing system 100. For example, the peripheral device adapters 103 may provide an interface to input/output devices, such as, for example, display device 109, a mouse, or a keyboard (not shown). The peripheral device adapters 103 may also provide access to other external devices such as an external storage device, a number of network devices such as, for example, servers, switches, and/or routers, client devices, other types of computing devices, and combinations thereof (not shown).

The display device 109 may be provided to allow a user of the computing system 100 to interact with and/or to implement the functionality of the computing system 100. The peripheral device adapters 103 may also create an interface between the processor 101 and the display device 109, a printer, or other media output devices. The network adapter 104 may provide an interface to other computing devices within, for example, a network, thereby enabling the transmission of data between the computing system 100 and other devices located within the network.

The computing system 100 may, when executed by the processor 101, display the number of graphical user interfaces (GUIs) on the display device 109 associated with the executable program code representing the number of applications stored on the data storage device 102. The GUIs may display, for example, interactive screenshots that allow a user to interact with the computing system 100 to input data values to a crossbar array 110 for various computation operations. For example, matrix values and input vector values may, in some embodiments, be stored in and/or input to the crossbar array 110 functioning as a dot product engine (DPE) for vector/matrix multiplication via the memory elements at junctions of the crossbar array. The memory elements in the crossbar array may, in some examples, be resistive memory (memristor) elements used in a memristor array, although embodiments are not limited to such memristor arrays, as will be described in more detail below. Additionally, via interacting with the GUIs of the display device 109, a user may obtain a dot product value based on the input data. Examples of display devices 109 include a computer screen, a laptop screen, a mobile device screen, a personal digital assistant (PDA) screen, and/or a tablet screen, among other display devices.

The computing system 100 may further include a crossbar array (xbar) 110, which may correspond to the "actual crossbar array" described herein. In various examples, the crossbar array 110 may be implemented as a memristive crossbar array 210, as illustrated at 210 in FIG. 2, and/or as a differential mode DPE memristive array, as illustrated at 320 in FIG. 3.

As described below, the crossbar array 110 may include a number of elements, including a number of memristors that function together within the array to perform a weighted sum of multiple inputs. The differential mode DPE memristive array may, for example, be used in a number of applications. For example, the differential mode DPE memristive array may be used as a threshold logic gate (TLG) to perform a matrix product to compare the output with a threshold. Thus, the differential mode DPE memristive array may be used as an accelerator in which the differential mode DPE memristive array performs a number of functions faster than is possible in software running on a more general-purpose processing device.

Although the crossbar array 110 is depicted as being a device internal to the computing system 100, in another example, the crossbar array 110 may be a peripheral device coupled to the computing system 100 or included within a peripheral device coupled to the computing system 100.

The computing system 100 further includes a number of modules used in the implementation of the systems and methods described herein. The various modules within the computing system 100 include executable program code that may be executed separately. In this example, the various modules may be stored as separate computer program products. In another example, the various modules within the computing system 100 may be combined within a number of computer program products; each computer program product may include a number of the modules.

The computing system 100 may include a compute engine 111 to, when executed by the processor 101, assist in the functionality of the crossbar array 110. The compute engine 111 may, for example, assist in the crossbar array 110 functioning as a DPE by receiving a number of input values defining a matrix to be processed in a dot product mathematical computation. The compute engine 111 may send the input values to the crossbar array 110 as programming signals to a number of memory elements (e.g., memristors) within the crossbar array 110 to program the memristors. The compute engine 111 also may receive an input vector to be processed in connection with the matrix programmed into the memristors. The compute engine 111 may further obtain a value representing the dot product, and convey that value as data to the computing system 100 or another computing device for analysis or further processing.

Figure 2:
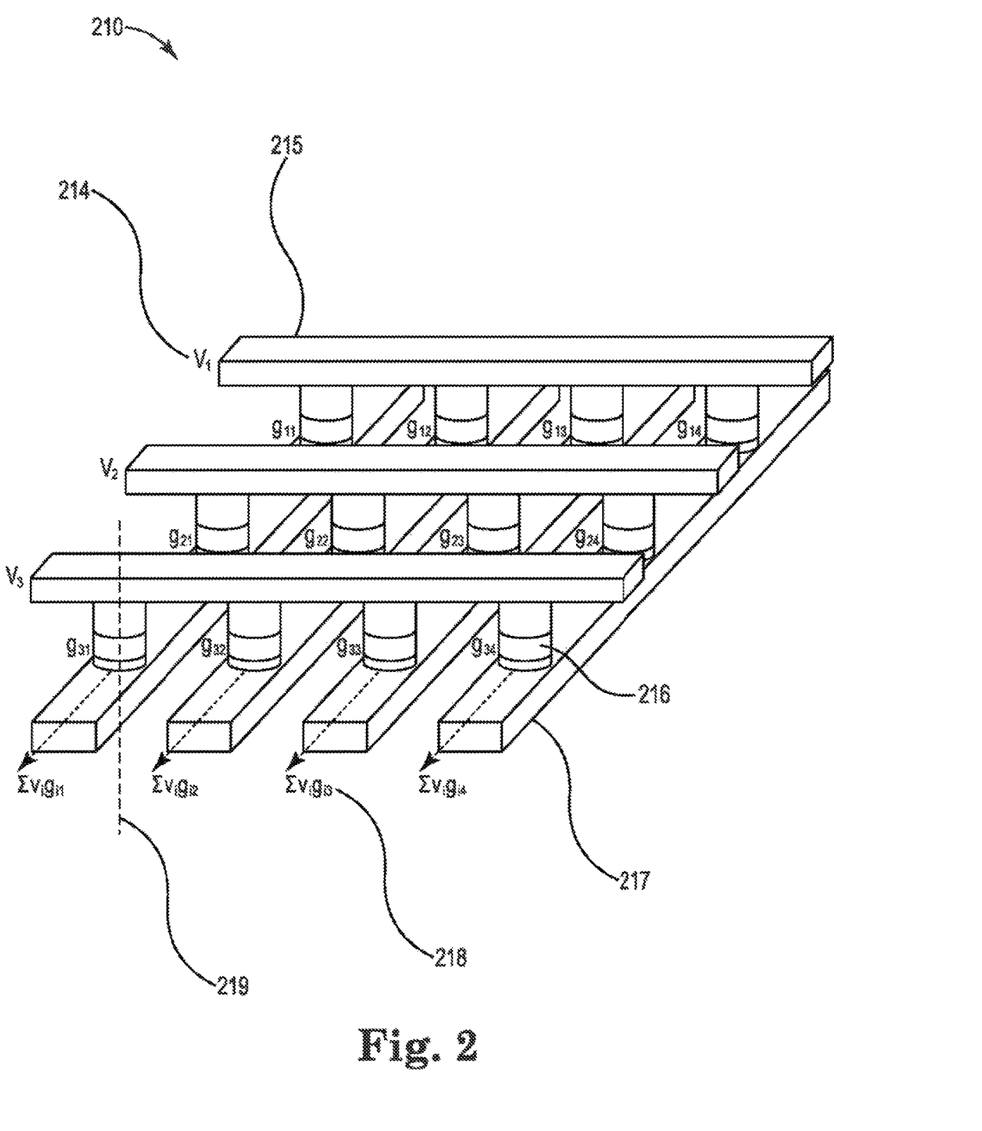
FIG. 2 illustrates a diagram of an example of a crossbar array for improved computational accuracy in a crossbar array according to the present disclosure.

FIG. 2 illustrates a diagram of an example of a crossbar array for improved computational accuracy in a crossbar array according to the present disclosure. The crossbar array 210 illustrated in FIG. 2 may be implemented with various types of memory elements and/or be used for various computational purposes within the scope of the present disclosure. For example, the crossbar array 210 may be a DPE array with memristor memory elements in the computing system 100 shown in FIG. 1. The memristive crossbar array 210 may include a number of electrically conductive row wires 215 and a number of electrically conductive column Iwires 217. Even though three row wires 215 and four column wires 217 are depicted in FIG. 2, any number of row wires 215 and column wires 217 may be present in the crossbar array 210. The row wires 215 and column wires 217 intersect at junctions as indicated by the dashed line 219. A number of memory elements 216 (e.g., resistive memory devices or "memristors") are individually located at each of the junctions 219 and electrically couple the row wires 215 to the column wires 217.

"Memristance" is a property of the electronic component referred to as a memristor. A memristor is a resistor device whose resistance can be changed. For example, if charge flows in one direction through a circuit, the resistance of a memristor component of the circuit may increase. In contrast, if charge flows in the opposite direction in the circuit, the resistance of the memristor component may decrease. If the flow of charge is stopped by turning off the applied voltage, the memristor component will "remember" the last resistance that it had, and when the flow of charge starts again the resistance of the circuit will be what it was when it was last active.

Conductance channels (e.g., filaments) in the memristors 216 may be formed in each of the memristors 216 and the memristors 216 may be individually addressed as bits. A crossbar 210 is an array of switches that connect each wire in one set of parallel row wires 215 to every member of a second set of parallel column wires 217 that intersects the first set 215 at junctions 219. In the example of FIG. 2, the row wires 215 and the column wires 217 are perpendicular with respect to each other, but the row wires 215 and the column wires 217 may intersect at any angle.

The memristors 216 may be formed at the micro- or nanoscale and may be used as memory element components in a wide variety of electronic circuits, such as, bases for memory and/or logic circuits and arrays. When used as memory, the memristors 216 may be used to store a bit of information (e.g., 1 or 0 in binary). When used as a logic circuit, the memristors 216 may be employed to represent bits in a field programmable gate array as the basis for a wired-logic programmable logic array, or, as described herein, as a DPE. The memristors 216 disclosed herein may also find use in a wide variety of other applications. The memristors 216 may be fabricated through any suitable fabrication process, for example, by chemical vapor deposition, sputtering, etching, lithography, and/or other suitable methods of fabricating memristors.

The memristive crossbar array 210 shown in FIG. 2 further illustrates a number of input values 214 indicated, for example, as V1, V2, and V3. The input values 214 may be program signals used to change the resistance values at each individual memristor 216 at each junction 219 in the crossbar array to create a representation (e.g., a mapping) of a mathematic matrix in which each value (e.g., a data value representing a digit) at each junction represents a value within the matrix. The change in resistance among the individual memristors 216 is an analog change from a low-to-high value or a high-to-low value. The change in the resistance vale may correspond to an inverse of a change of a conductance value. In this manner, the memristors are "memory resistors" in that they "remember" the last resistance that they had.

The input values 214 may also be read signals used to read the resistance values at each individual memristor 216 at each junction 219 in the crossbar array 210, and/or as an input vector values to be multiplied by a stored matrix value at each memristor 216 involved in the calculation. The read signals referred to herein as a vector signals may be applied as second input values 214 to the row wires 215 of the memristive crossbar array 210. The input vector signals may represent a vector to be multiplied in the memristors 216 of the matrix. For example, the vector signals have a relatively lower voltage value than the first voltages used to program the memristors 216 such that the voltage level applied by the vector signals does not change the resistance values of the memristors 216 as programmed by the first voltages. The vector signals may act as read signals in this manner by not changing the resistance values of the memristors 216. An initial signal may, for example, be applied to the memristors 216 before application of the program signals and the vector signals in order to set the resistivity (conductivity) of the memristors 216 to a known value.

The vector signals may interact with the memristors 216 at their respective junctions 219, and the resulting current may be collected at the end 218 of each column wire 217. The sum current of each column wire 217 is represented by $\Sigma_{v_ig_a}$, $\Sigma_{v_ig_a}$, $\Sigma_{v_ig_a}$, and $\Sigma_{v_ig_a}$, as indicated in FIG. 2, where $g_{31}$ are the memristor 216 conductance values. The sums obtained from the voltage values represent the values of a column vector. The sums of each column wire 217 may also be collectively summed by being sent through a collection line 328 to obtain a single value of $\Sigma_{i=1}^{m}$ Iouti, as shown at 329 in FIG. 3. A plurality of Vout and/or Iout signal values may be converted to the summed single value of $\Sigma_{i=1}^{m}$ Iouti by a compute engine. Such a compute engine, as shown at and described in connection with 111 in FIG. 1 and elsewhere, may contribute to the improved computational accuracy in a crossbar array as described herein.

Figure 3:
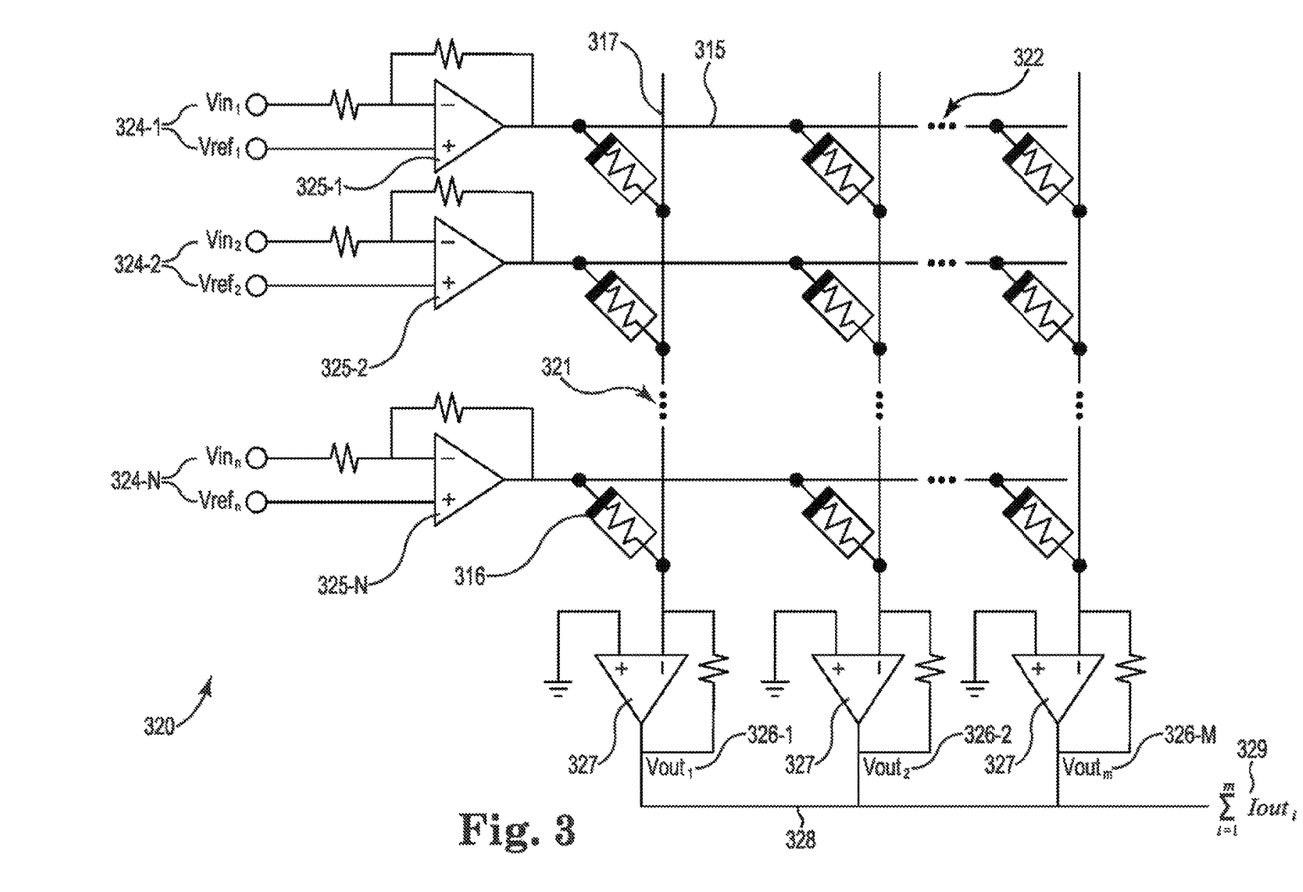
FIG. 3 illustrates a circuit diagram of an example of a crossbar array for improved computational accuracy in a crossbar array according to the present disclosure.

FIG. 3 illustrates a circuit diagram of an example of a crossbar array for improved computational accuracy in a crossbar array according to the present disclosure. The circuit diagram shown in FIG. 3 illustrates a DPE memristive array 320, which may be fabricated as described in connection with the crossbar array 210 of FIG. 2. For example, the circuit diagram shows the DPE memristive array 320 to be a differential mode DPE memristive array.

Although the differential mode DPE memristive array 320 of FIG. 3 is illustrated as having a circuit layout as depicted, any number of circuit layouts may be used to achieve the functionalities of the present disclosure.

The differential mode DPE memristive array 320 as depicted in FIG. 3 includes the row wires 315, the column wires 317, and the memristors 316 as described in connection with FIG. 2. As previously stated, any number of row wires 315 and column wires 317 may be included within the differential mode DPE memristive array 320 as indicated by the ellipses 321, 322. For example, the number of row wires 315 and column wires 317 included within the differential mode DPE memristive array 320 may be equal or greater than the size of the matrix of the dot product to be calculated using the systems and methods described herein.

The differential mode DPE memristive array 320 may further include a number of differential input circuits such as, for example, input amplifiers 325-1, 325-2, . . . , 325-N at the input terminals of the row wires 315. The input amplifiers 325 are designed to be differential amplifiers in order to make the DPE memristive array a differential mode DPE memristive array 320. Although input amplifiers 325 are depicted in FIG. 3, any type of differential input circuit may be used. The input amplifiers 325 shown are designed with negative feedback that subtracts a fraction of the output of the input amplifiers 325 from the input in order to improve gain stability, linearity, frequency response, and step response, and/or to reduce sensitivity to parameter variations due to manufacturing or the environment.

Input voltages ($Vin_1$, $Vin_2$, . . . , $Vin_n$) and reference voltages ($Vref_1$, $Vref_2$, . . . , $Vref_n$) may be applied through separate input lines 324-1, 324-2, . . . , 324-N to the input amplifiers 325-1, 325-2, . . . , 325-N to obtain a dot product value. However, the crossbar arrays described herein as DPEs are not limited to being a differential mode DPE memristive array 320. For example, a DPE may be fabricated without the separate input lines 324 and/or the input amplifiers 325 such that input voltages can be directly input to the row wires 315.

For each output voltage of a DPE memristive array, the following relationship may exist:

$$V_{out} = -R_f \sum V_{ini} \times \frac{1}{Ri},$$

where Vout may correspond to $Vout_1$, $Vout_2$, . . . , $Vout_m$ shown at 326-1, 326-2, . . . 326-M in FIG. 3, $Vin_1$ may correspond to $Vin_1$, $Vin_2$, . . . , $Vin_n$, Rf may be the input amplifier 325 feedback resistance and R, may be the memristor 316 multilevel analog resistance predefined before calculation of a dot product.

Output voltages $Vout_1$, $Vout_2$, . . . , $Vout_m$ shown at 326-1, 326-2, . . . 326-M, respectively, may, for example, be amplified by corresponding output amplifiers 327 to obtain a dot product value. The output voltage sums of each column wire 317 may be converted to current and, for example, sent through the collection line 328 to obtain the single current value of $\Sigma_{i=1}^{m} Iouti$ shown at 329.

Memristors 316 are analog devices that may have nonlinearity in current output. For example, such nonlinearity may occur at large signal voltages. Memristors 316 may have better linearity when operating with smaller voltage signals. For example, operating a memristor 316 in the region of [0V, 1V] may result in greater output nonlinearity as compared to operating the memristor 316 in the [−½V, ½V] region. Such nonlinearity at large voltage levels may be compensated for by operating in a particular lower voltage range, for example.

In contrast, crossbar array structures may have other causes of voltage and/or current output nonlinearity, for example, as measured across a sequence of rows and/or a sequence of columns of the array, for which compensation may not be accomplished just by adjusting a voltage operating range. Such causes of output nonlinearity for crossbar arrays may include increasing wire resistance that, for example, may correlate with distance of a column from an input signal in a row, resistance for signal input and/or output, inherent device nonlinearity, thermal effects, noise, and/or other parasitics, which may reduce computational accuracy relative to target (ideal) results if the crossbar array is operated in a "naïve" way.

As used herein, the naïve way is intended to mean linearly mapping the matrix W to be used in the vector-matrix multiplication to conductance G of an ideal crossbar (e.g., not taking into account the causes of output nonlinearity just presented) to result in $Iout=Vin^T G$, where $Vin^T$ is the transpose of the input voltage Vin. However, real current output may be different because of one or more of the causes of output nonlinearity just presented. To reduce the effects of these and other causes of output nonlinearity on computational accuracy, the present disclosure describes adjusting the actual conductance of memory elements (e.g., memristors) to have conductance closer to the ideal conductance of the memory elements in an ideal crossbar array in order to at least partially restore output linearity.

Figure 4:
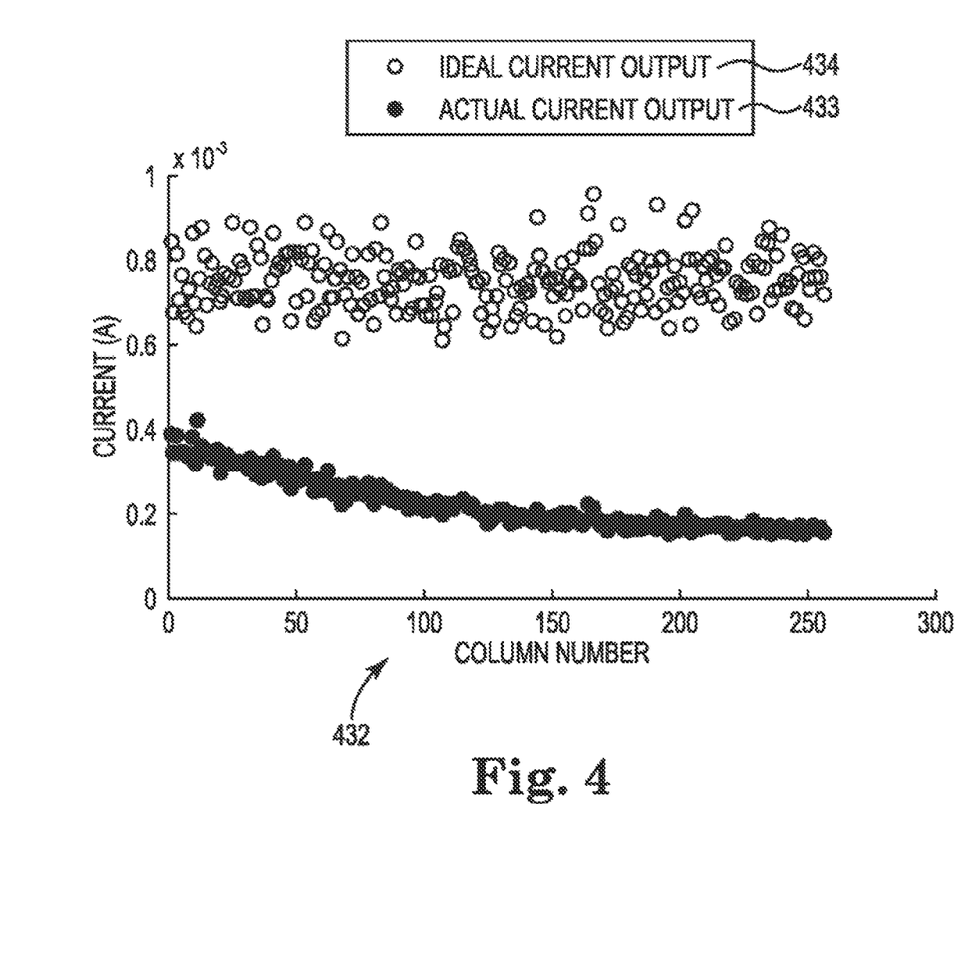
FIG. 4 illustrates a diagram of an example of nonlinearity of output of an actual crossbar array compared to an ideal crossbar array according to the present disclosure.

FIG. 4 illustrates a diagram of an example of nonlinearity of output of an actual crossbar array compared to an ideal crossbar array according to the present disclosure. A graph 432 in FIG. 4 illustrates a progressive decrease of actual current output 433 (in amperes (Iout)) from an actual crossbar array, to which a corresponding progressive decrease in voltage output (Vout) may contribute. The progressive decrease of the actual current output 433 is shown to be related to a distance of a column wire (represented on the horizontal axis as a column number) from input of a signal to an intersecting row. Respective distances may be of the column wires 317 shown in FIG. 3, from a position of input, for example, from an input line 324 and/or an input amplifier 325, of input voltage Vin of an input vector to a row, for example, row wire 315.

For example, when a Vin of 0.5 volts (V) is input to a particular row wire, an actual Iout of around $0.4 \times 10^{-3}$ amperes (A) may be measured for a column wire near columns 1-10 and an actual Iout of around $0.2 \times 10^{-3}$ A may be measured for a column wire near columns 245-256. The decrease in actual Iout for column wires between the two ends of the row wire may be nonlinear, for example, by curving between columns 1-256. As illustrated in FIG. 4, the actual current output 433 shows a concave curve between columns 1-256, although a convex curve or various combinations of convex and/or concave curves may contribute to the nonlinearity. The progressive decrease of the actual Iout in the crossbar array may be contributed to by a number of the causes described herein, including increasing wire resistance that correlates with the distance of the column from the Vin to the row.

A conductance of memory elements (e.g., memristors) at a plurality of junctions of the actual crossbar array may be determined, for example, by a determine engine. Measurements of the progressive decrease of the actual Iout corresponding to a number of rows and columns in the actual crossbar array may contribute to determination of the conductance of the memory elements at the junctions thereof. In some examples, actual conductance of some or all of the memory elements in the actual crossbar array may be directly or indirectly measured. Alternatively or in addition, a number of models of signal output variation in crossbar arrays may be used in determination of the conductance of the memory elements (e.g., in a simulated crossbar array and/or as applied to the actual crossbar array). The number of models may take into consideration with regard to determination of the conductance, for example, nonlinearity of wire resistance dependent upon distance from an input source in the crossbar array and/or other causes of signal output nonlinearity, input and/or output resistance, thermal effects, noise, and/or parasitics, etc.

By comparison, a range of ideal Iout values may be calculated, for example by a calculate engine, as described herein, for a simulated ideal crossbar array. The calculations of the ideal current output 434 may be performed by not taking into account the causes of Iout nonlinearity described herein. To contribute to calculation of the ideal current output 434, the ideal conductance of the memory elements (e.g., memristors) at a plurality of junctions of the crossbar array may be calculated. As such, when a Vin of 0.5 V is simulated as being input to a particular row wire, an ideal Iout of, for example, around $0.8 \times 10^{-3}$ A may be calculated for the column wires throughout the sequence of columns 1-256.

The larger variability of ideal Iout for adjacent columns in the simulated ideal crossbar array, relative to the variability of the actual Iout for the same columns in the actual crossbar array, is not necessarily present in the calculations for the simulated ideal crossbar array. However, the larger variability may, for example, result from a randomness variable in the calculation of the deal Iout that provides the larger variability based on the larger lower amperage of the ideal Iout, for example, relative to the amperage of the actual Iout.

The range of values for the ideal Iout sequence of the ideal crossbar array is relatively stable and may not show a notable upward or downward slope, thereby being suitable for linear mapping. In contrast, the range of values for the actual Iout sequence of the actual crossbar array may not be suitable for linear mapping because, for example, of a progressive downward slope of the actual Iout for the sequence of columns 1-256, which may be combined with various amounts of curvature.

Accordingly, as described herein, based at least partially on determination of conductance of the memory elements of the actual crossbar array, actual conductance of at least one memory element may be adjusted to improve computational accuracy by reduction of a difference between the ideal conductance and the determined conductance of the at least one memory element. In some examples, the actual conductance of a selected memory element (e.g., a memristor) may be adjusted by application of a voltage value determined to adjust the conductance of the memory element to an intended level. In some examples, the actual conductance of a selected memory element may be adjusted by application of a sequence of voltage pulses to adjust the conductance of the memory element to the intended level. Control of how many voltage pulses to apply and/or monitoring when the intended level of conductance of the memory element has been reached may be performed, for example, using closed-loop voltage pulse tuning of the memory elements. In some examples, the closed-loop voltage pulse tuning may be controlled by a proportional-integral-derivative controller.

Figure 5:
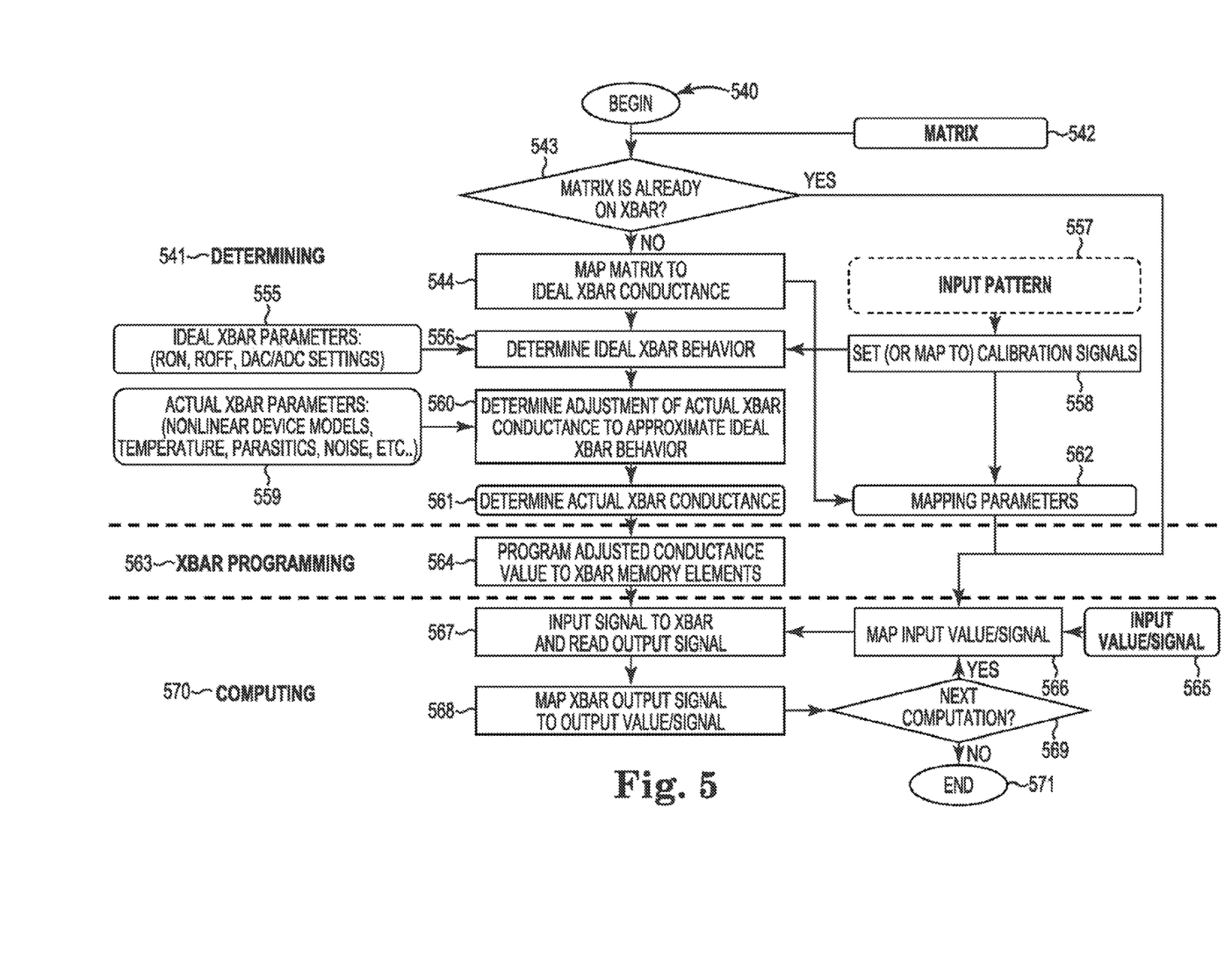
FIG. 5 illustrates a flow chart of an example process for improved computational accuracy in a crossbar array according to the present disclosure.

FIG. 5 illustrates a flow chart of an example process for improved computational accuracy in a crossbar array according to the present disclosure. For clarity the process is illustrated as being separated into three portions, namely, determining 541, crossbar (xbar) programming 563, and computing 570. However, the process may be implemented as a single portion (e.g., a single sequence of functions) or any number of portions that may correspond to, for example, the number of engines and/or modules described herein or otherwise.

The process may begin 540 in the determining portion 541 with, in some examples, input of the matrix values 542 to determined (e.g., predetermined) memory elements of the xbar array. In some examples, the process may begin 540 without matrix values being input to memory elements of the xbar array. The process may proceed to a determination 543 of whether matrix data values have been stored by the memory elements of the xbar array.

When a determination is made that the matrix values 542 have been input to the xbar array (matrix), the xbar matrix may not be in a state suitable for performance of subsequent functions shown in the determining portion 541 and/or the xbar programming portion 563 of the process. As such, the process may skip the subsequent determining portion 541 and/or the xbar programming portion 563 to proceed to the computing portion 570, as described further herein.

In contrast, when a determination is made that no matrix values have been input to the xbar matrix, the xbar matrix may be determined to be in a state suitable for performance of subsequent functions shown in the determining portion 541 and/or the xbar programming portion 563 of the process. As such, the configuration of the actual xbar matrix may be mapped to determine a corresponding configuration for an ideal (e.g., simulated) xbar matrix 544 for use in determining ideal conductance of memory elements at junctions in the ideal xbar matrix corresponding to the memory elements in the actual xbar matrix.

A behavior of the ideal xbar matrix may be determined 556. The ideal conductance of the memory elements of the ideal xbar matrix may be at least part of the behavior that is determined. To contribute to determination of the ideal conductance of the memory elements, a predetermined input pattern 557 may be used. The predetermined input pattern 557 may, for example, include a selection of memory elements at particular positions in the xbar matrix to be used in determination of adjustment (e.g., calibration) of the conductance in the actual xbar matrix. In some examples, the predetermined input pattern 557 may include particular input voltages to simulate setting the conductance of the memory elements of the ideal xbar matrix to a particular level. For example, a simulated input vector pattern may be used to determine (e.g., calculate) the ideal conductance of memory elements at the plurality of junctions of the crossbar array corresponding to the input vector pattern. The predetermined input pattern 557 may be set (or mapped) 558 to the ideal xbar matrix as calibration signals.

An effective calibration signal may be an input signal (e.g., Vin) of, for example, an input vector that may later be input for computation by a DPE. However, a particular input signal that would be input in the future may be unknown at the time of calibration, although the the predetermined input pattern 557 of input signals to be input in the future may be known at the time of calibration. As such, the DPE, for example, may be calibrated with simulated input signal voltages in the predetermined input pattern 557 that cover a range of expected actual input signal voltages for input to memory elements at particular positions in the xbar matrix.

Input of a number of ideal crossbar parameters 555 may, in some examples, be used in determination (e.g., calculation) of the ideal conductance of memory elements at the plurality of junctions of the ideal crossbar array. In various examples, the number of ideal crossbar parameters may include an ON state resistance of the ideal crossbar, an OFF state resistance of the ideal crossbar, digital-to-analog converter (DAC) settings, and/or analog-to-digital converter (ADC) settings, among other possible parameters usable in determination of the ideal conductance of the memory elements.

In some examples, as described herein, a number of actual xbar matrix parameters 559 may be input for use in determination of an adjustment of the actual conductance of memory elements of the actual xbar matrix 560 in order to approximate the behavior of the ideal xbar matrix. Such a simulation may be performed using a number of the actual xbar matrix parameters 559. As described herein, the actual xbar matrix parameters 559 may include a number of models of signal output variation in crossbar arrays, including nonlinearity of wire resistance and/or other causes of signal output nonlinearity, input and/or output resistance, thermal effects, noise, and/or parasitics, etc. Alternatively or in addition, a determination (e.g., measurement) of actual xbar matrix conductance 561 may be used in determination (e.g., calculation) of an adjustment of the actual conductance of memory elements of the actual xbar matrix in order to approximate the behavior of the ideal xbar matrix.

Following determination of a change (e.g., level of adjustment) in a conductance value for each memory element to be adjusted to approximate the behavior of the ideal xbar matrix, the process may, in some examples, proceed to the xbar programming portion 563. Within the xbar programming portion 563, in some examples, the determined change in the conductance value may be executed by a programmed change 564 in the conductance values for each of the memory elements to be adjusted (calibrated). As described herein, the programmed change in conductance may be executed, in some examples, by closed-loop voltage pulse tuning of the memory elements, among other possible implementations for adjusting the conductance by application of determined voltage to the memory elements.

Following changing the conductance values for each of the memory elements to be adjusted in the actual xbar matrix, the process may, in some examples, proceed to the computing portion 570. Within the computing portion 570, in these examples, an input signal (e.g., Vin) of, for example, an input vector, may be input to the actual xbar matrix and a number of output signals (e.g., Vout and/or Iout) may be read from the actual xbar matrix 567. An xbar output signal may be mapped 568 to convert the output signal value to obtain an output value. For example, an analog Vout and/or Iout signal value may be converted to a corresponding digital data value, as mapped appropriately to the actual xbar matrix. In some examples, the mapping and/or the conversion of a plurality of Vout and/or Iout signal values to, for example, the summed single value of $\Sigma_{i=1}^{m}$ Iouti may be performed by a compute engine (e.g., as shown at and described in connection with 111 in FIG. 1 and elsewhere).

The output signals and/or output values may, in some examples, be compared to corresponding ideal output signals and/or output values to determine whether the changes made to the conductance of the memory elements resulted in output from the actual xbar matrix being brought close enough to the output of the ideal xbar matrix. If the output from the actual xbar matrix is determined not to be close enough to the output of the ideal xbar matrix (e.g., either by operator and/or programmed inspection), the process just described may be repeated.

In situations where the matrix values have been determined at 543 to already have been input to the actual xbar matrix, the input value/signal 565 (e.g., Vin) may be input directly to the computing portion 570 of the process. For example, the determining portion 541 and/or the xbar programming portion 563 of the process may be skipped based on the determination that the matrix values have already been input to the actual xbar matrix because such a determination may indicate that adjustment (calibration) of the conductance of the memory elements of the actual xbar matrix has already been performed. As such, mapping parameters 562 may be used to map 566 the input value/signal 565, for example, an input vector, to the actual xbar matrix. In various examples, the mapping parameters 562 may be determined from mapping the xbar matrix to ideal xbar conductance at 544 and/or from already saved mapping parameters of the actual xbar matrix.

Following each occurrence of the output signals (e.g., Vout and/or Iout) being read 567, mapped 568, and/or converted to obtain an output value, a determination 569 may be made as to whether a next computation is to be performed. When a determination 569 is made that there is a next computation to be performed, and another iteration of the determining portion 541 and/or the xbar programming portion 563 are not to be performed, a next input value/signal 565 (e.g., an input vector) may be input and mapped 566 to the actual xbar matrix for performance of the next computation. A determination that another iteration of the determining portion 541 and/or the xbar programming portion 563 will not to be performed may be based, for example, upon a determination that the previous adjustment of the conductance of the memory elements has satisfactorily approximated the conductance of the ideal xbar matrix. When a determination 569 is made that there is not a next computation to be performed, the process may end 571.

Figure 6:
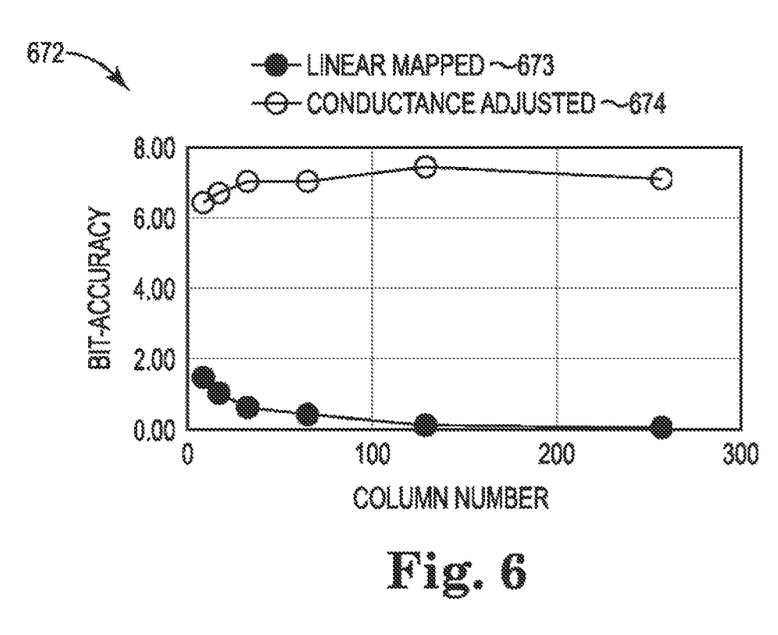
FIG. 6 illustrates a diagram of an example of improved computational accuracy in a crossbar array with adjusted conductance of memory elements according to the present disclosure.

FIG. 6 illustrates a diagram of an example of improved computational accuracy in a crossbar array with adjusted conductance of memory elements according to the present disclosure. FIG. 6 shows a graph 672 that illustrates comparative computational accuracy for outputs from crossbar arrays of various sizes that have been linearly mapped 673 without adjustment of memory cell conductance, as described herein, and following adjustment (calibration) of the conductance 674.

The size of the crossbar arrays shown in FIG. 6 is represented by the column number on the horizontal axis. For a square crossbar array, the column number also may correspond to the row number in the crossbar array, both of which may thus correspond to a number of memory elements (e.g., memristors) at junctions of the column wires and the row wires. As described herein, due to causes including nonlinearity of increasing resistance, among other causes, the accuracy of output of a crossbar array may progressively decrease corresponding to an increase in the size of the crossbar array.

For example, FIG. 6 shows determinations of bit-accuracy for crossbar arrays ranging from 2 rows×2 columns (2×2) to 256 rows×256 columns (256×256). By way of example, the bit-accuracy scale shown on the vertical axis is for vector-matrix multiplication done by a DPE. The particular values of 0.00 through 8.00 on the vertical axis represent values for N. An N bit-accuracy may represent $2^N$ distinguishable levels in a range of signals, where a higher number of distinguishable levels corresponds to a higher accuracy in signal output from the crossbar array.

Accordingly, the results for a linear mapped crossbar array 673, in which the conductance of the memristors has not been adjusted, show a bit-accuracy of less than 2.00 for a 2×2 crossbar array. The bit-accuracy progressively decreases nonlinearly as the size of the crossbar array approaches 256×256.

In contrast, the results for a crossbar array 674 in which the conductance of the memristors has been adjusted show a bit-accuracy of greater than 6.00 for a 2×2 crossbar array. The bit-accuracy for the crossbar array in which the conductance of the memristors has been adjusted does not show a decrease as the size of the crossbar array approaches 256×256. Hence, adjustment of the conductance of memory elements may be demonstrated to improve computational accuracy in a crossbar array.

Figure 7:
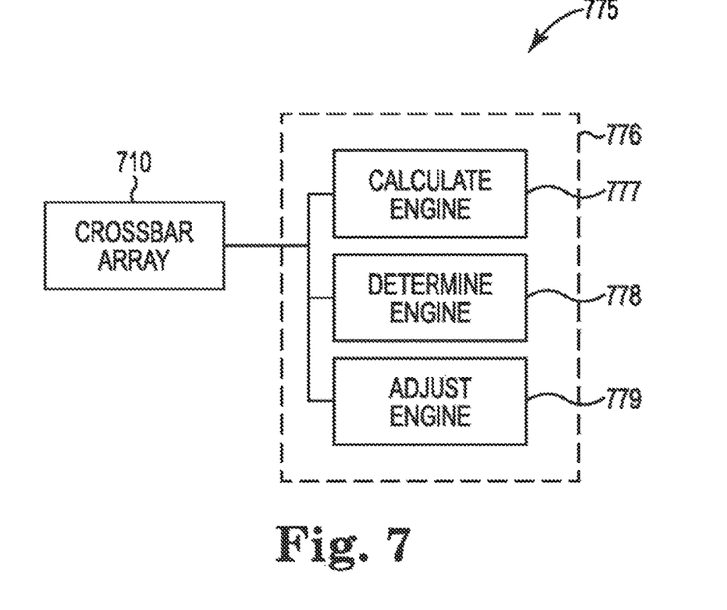
FIG. 7 illustrates a diagram of an example of a system for improved computational accuracy in a crossbar array according to the present disclosure.

FIG. 7 illustrates a diagram of an example of a system for improved computational accuracy in a crossbar array according to the present disclosure. The system 775 may include a combination of an actual crossbar array 710 (e.g., as described in connection with FIGS. 1-3, etc.), and a number of engines 776 to enable execution of particular tasks 777, 778, 779. The system 775 may be in communication with the actual crossbar array 710 via a communication link, and may include the number of engines (e.g., calculate engine 777, determine engine 778, adjust engine 779, etc.). The system 775 may include additional or fewer engines than illustrated to perform the various tasks described herein. The system 775 may represent programmed instructions and/or hardware.

The number of engines may include a combination of hardware and instructions (e.g., programming) to perform a number of tasks described herein (e.g., to contribute to improvement of computational accuracy by reduction of a difference between ideal conductance and determined conductance of memory elements, etc.). The instructions may be executable by a processing resource and stored in a non-transitory memory resource (e.g., computer-readable medium (CRM), machine-readable medium (MRM), etc.), or may be hard-wired in hardware (e.g., logic).

As described herein, the system 775 may include an actual crossbar array 710 that includes a plurality of memory elements, where a memory element may be located, for example, at each junction of the crossbar array. The actual crossbar array 710 is usable in performance of various types of computations. For example, the actual crossbar array 710 may be used as a DPE for vector-matrix multiplication, among other computations suitable for a crossbar array.

The calculate engine 777 may include hardware and/or a combination of hardware and instructions (e.g., programming) to calculate ideal conductance of memory elements at a plurality of junctions of the crossbar array. As described herein the ideal conductance of the memory elements may be calculated using a simulated ideal crossbar array with at least some of the causes of output voltage and/or current nonlinearity described herein not included in the simulation of the ideal crossbar array.

The determine engine 778 may include hardware and/or a combination of hardware and instructions (e.g., programming) to determine conductance of the memory elements at the plurality of junctions of the actual crossbar array 710. The determine engine 778 may determine the conductance of the memory elements using at least one of the measurements of the progressive decrease of the actual Iout corresponding to a number of rows and columns in the actual crossbar array, direct and/or indirect measurements of the conductance of the memory elements at the junctions of the actual crossbar array, and/or usage of a number of models of signal output variation in crossbar arrays, as described herein.

The adjust engine 779 may include hardware and/or a combination of hardware and instructions (e.g., programming) to adjust conductance of at least one memory element to improve computational accuracy by reduction of a difference between the ideal conductance and the determined conductance of the at least one memory element. The conductance of the least one memory element may be adjusted, in various examples, by application of one or more determined voltages (e.g., pulses) to the least one memory element by the adjust engine 779 to adjust the conductance, as described herein. As such, in some examples, the adjust engine 779 may include, or be associated with, hardware for closed-loop voltage pulse tuning, for example. In various examples, the at least one memory element for which the conductance is adjusted may be a resistive memory element (e.g., a memristor), a phase change memory element, a floating gate memory element, among other types of memory elements implemented in the crossbar array as appropriate for particular types of computations.

In some examples, the system 775 may include a compute engine, for example, as shown at 111 in FIG. 1. The compute engine may be used to perform a number of functions. For example, the compute engine may be used to input an input value to the actual crossbar array 710, map the input value to a determined memory element in the actual crossbar array, direct the input value to the determined memory element, where the input value affects conductance of the determined memory element (either as a data input voltage value or as a determined voltage value intended for adjustment of the conductance), read an output signal from the determined memory element, and/or map the output signal as an output value relative to the input value. For the intended adjustment of the conductance, for example, the input value may correspond to a magnitude of an input voltage signal, the output value may correspond to a magnitude of an output current signal, and the magnitude of the output current signal may be affected by the adjustment (determined change) of the conductance of the determined memory element to a level corresponding to the magnitude of the input voltage signal.

As described herein, the adjustment of the conductance of the determined memory element by the determined voltage may improve computational accuracy by the output value being shifted closer to an ideal output calculated by the calculate engine 777. In some examples, the conductance of a plurality of memory elements (e.g., some or all of the memory elements in the actual crossbar array 710) may be adjusted to shift the output value closer to an ideal output for each of the memory elements calculated by the calculate engine 777.

Figure 8:
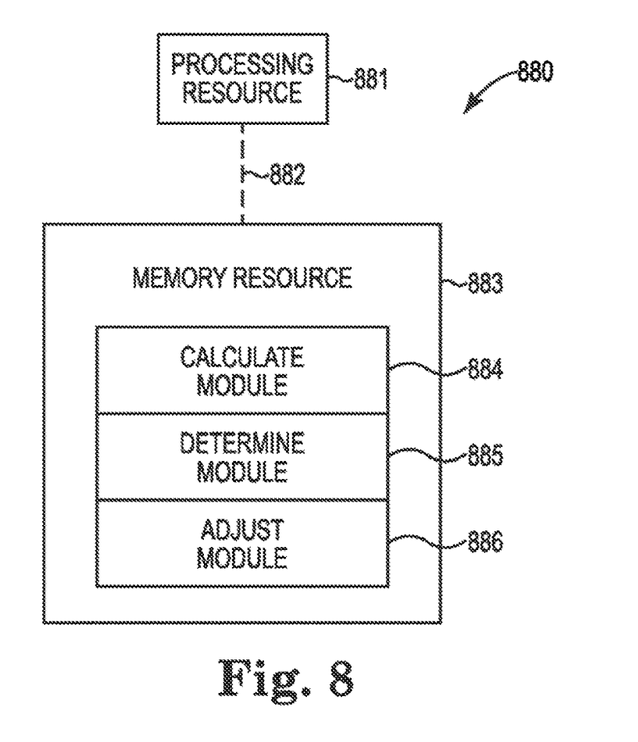
FIG. 8 illustrates a diagram of an example computing device for improved computational accuracy in a crossbar array according to the present disclosure.

FIG. 8 illustrates a diagram of an example computing device for improved computational accuracy in a crossbar array according to the present disclosure. The computing device 880 may utilize programmed instructions, hardware, hardware with instructions, and/or logic to perform a number of tasks described herein. The computing device 880 may include additional or fewer modules than illustrated to execute the various tasks described herein.

The computing device 880 may be any combination of hardware and program instructions to share information. The hardware, for example, may include a processing resource 881 and/or a memory resource 883 (e.g., CRM, MRM, database, etc.) The processing resource 881, as used herein, may include any number of processors capable of executing instructions stored by the memory resource 883. The processing resource 881 may be integrated in a single device or distributed across multiple devices. The program instructions (e.g., computer-readable instructions (CRI), machine-readable instructions (MRI), etc.) may include instructions stored on the memory resource 883 and executable by the processing resource 881 to implement a desired task (e.g., calculate ideal conductance of memory elements at a plurality of junctions of a crossbar array, etc.).

The memory resource 883 may be in communication with the processing resource 881. The memory resource 883, as used herein, may include any number of memory components capable of storing instructions that may be executed by the processing resource 881. Such a memory resource 883 may be a non-transitory CRM or MRM. The memory resource 883 may be integrated in a single device or distributed across multiple devices. Further, the memory resource 883 may be fully or partially integrated in the same device as the processing resource 881 or it may be separate but accessible to that device and processing resource 881. Thus, the computing device 880 may be implemented on a participant device, on a server device, on a collection of server devices, and/or on a combination of the user device and the server device.

The memory resource 883 may be in communication with the processing resource 881 via a communication link (e.g., path) 882. The communication link 882 may be local or remote to a machine (e.g., a computing device) associated with the processing resource 881. Examples of a local communication link 882 may include an electronic bus internal to a machine (e.g., a computing device) where the memory resource 883 is one of volatile, non-volatile, fixed, and/or removable storage medium in communication with the processing resource 881 via the electronic bus.

A number of modules 884, 885, 886 may include MRI that when executed by the processing resource 881 may perform a number of tasks. The number of modules 884, 885, 886 may be sub-modules of other modules. For example, the calculate module 884 and the determine module 885 may be sub-modules and/or contained within the same computing device. In another example, the number of modules 884, 885, 886 may comprise individual modules at separate and distinct locations (e.g., CRM, MRM, etc.).

Each of the number of modules 884, 885, 886 may include instructions that when executed by the processing resource 552 may function as a corresponding engine, as described herein. For example, calculate module 884 may include instructions that when executed by the processing resource 881 may function as the calculate engine 777. In another example, the adjust module 886 may include instructions that when executed by the processing resource 881 may function as the adjust engine 779.

The calculate module 884 may include MRI that when executed by the processing resource 881 may perform a number of tasks. For example, the calculate module 884 may calculate ideal conductance of memory elements at a plurality of junctions of a crossbar array, as described in connection with the calculate engine 777. The calculate module 884 may include further MRI that when executed by the processing resource 881 may perform input of an input vector pattern to calculate the ideal conductance of memory elements at the plurality of junctions of the crossbar array corresponding to the input vector pattern, as described in connection with 556, 557, 558 in FIG. 5. The calculate module 884 may include further MRI that when executed by the processing resource 881 may perform input of a number of ideal crossbar parameters to calculate the ideal conductance of memory elements at the plurality of junctions of the crossbar array, as described in connection with 555, 556 in FIG. 5.

The determine module 885 may include MRI that when executed by the processing resource 881 may perform a number of tasks. For example, the determine module 885 may be used to determine actual conductance of the memory elements at the plurality of junctions of the actual crossbar array, as described in connection with the determine engine 778. The determine module 885 may include further MRI that when executed by the processing resource 881 may perform input of a number of actual crossbar parameters to determine the adjustment of the actual conductance, as described in connection with 559, 560 in FIG. 5. The input of the number of actual crossbar parameters may, for example, include a number of models of signal output variation in crossbar arrays, among other possible actual crossbar parameters.

The adjust module 886 may include MRI that when executed by the processing resource 881 may perform a number of tasks. For example, the adjust module 886 may be used to determine an adjustment of the actual conductance of at least one memory element in the actual crossbar array to approximate the ideal conductance of the at least one memory element in the ideal crossbar array, as described in connection with the adjust engine 779. The adjust module 886 may include further MRI that when executed by the processing resource 881 may perform programming of conductance of the at least one memory element to a higher conductance to improve computational accuracy by reduction of a difference between the ideal conductance and the determined conductance, as described in connection with 563, 564 in FIG. 5.

Figure 9:
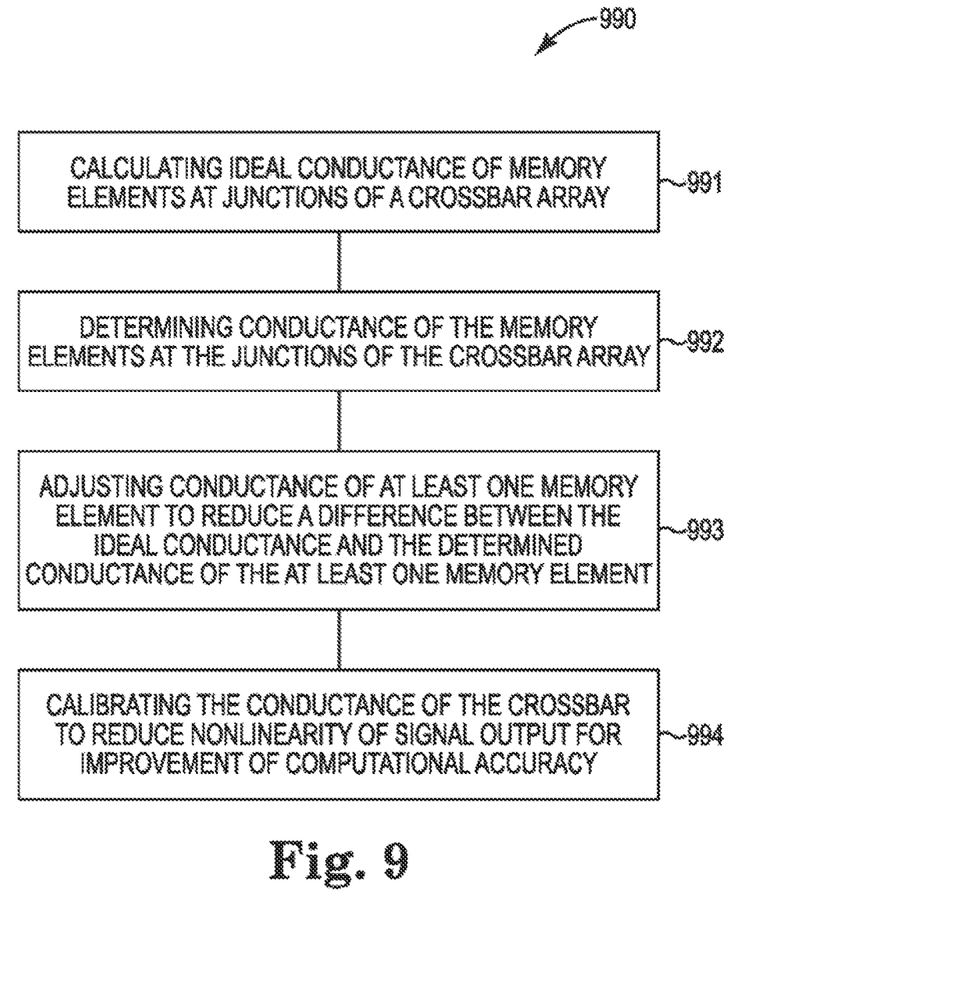
FIG. 9 illustrates a flow diagram of an example method for improved computational accuracy in a crossbar array according to the present disclosure.

FIG. 9 illustrates a flow diagram of an example method for improved computational accuracy in a crossbar array according to the present disclosure. Unless explicitly stated, the method examples described herein are not constrained to a particular order or sequence. Additionally, some of the described method examples, or elements thereof, may be performed at the same, or substantially the same, point in time. As described herein, the actions, tasks, functions, calculations, data manipulations and/or storage, etc., may be performed by execution of non-transitory machine-readable instructions stored in a number of memories (e.g., programmed instructions, hardware with instructions, hardware, and/or logic, etc.) of a number of applications. As such, a number of computing resources with a number of interfaces (e.g., user interfaces) may be utilized for implementing the methods described herein (e.g., via accessing a number of computing resources via the user interfaces).

The present disclosure describes a method 990 for calculating ideal conductance of memory elements at junctions of a crossbar array, as shown at 991 in FIG. 9. With regard to calculation of the ideal conductance, the crossbar array may be a simulated (e.g., ideal) crossbar array, for example, as described in connection with FIG. 4. At 992, the method may include determining conductance of the memory elements at the junctions of the crossbar array. With regard to determining the conductance, the conductance may, in some examples, be determined from an actual crossbar array using various techniques, for example, as described in connection with FIG. 4. At 993, the method may include adjusting conductance of at least one memory element to reduce a difference between the ideal conductance and the determined conductance of the at least one memory element, for example, as described in connection with 779 in FIG. 7.

At 993, the method may include calibrating (adjusting) the conductance of the crossbar to reduce nonlinearity of signal output for improvement of computational accuracy, for example, as described in connection with 563, 564 in FIG. 5. In some examples, computational accuracy of the actual crossbar array may be determined by how close to being equal to an ideal current output, determined for a corresponding ideal crossbar array, an actual current output is after calibration of the crossbar array. An improvement in computational accuracy may, in some examples, be determined by how close to being equal to the ideal current output the actual current output is relative to before the calibration.

As used herein, "a" or "a number of" something may refer to one or more such things. For example, "a number of widgets" may refer to one or more widgets. Also, as used herein, "a plurality of" something may refer to more than one of such things.

As used herein, "logic" is an alternative or additional processing resource to perform a particular action and/or function, etc., described herein, which includes hardware (e.g., various forms of transistor logic, application specific integrated circuits (ASICs), etc.), as opposed to computer executable instructions (e.g., programmed instructions, hardware with instructions, etc.) stored in memory and executable by a processor.

The figures herein follow a numbering convention in which the first digit corresponds to the drawing figure number and the remaining digits identify an element or component in the drawing. For example, 114 may reference element "14" in FIG. 1, and a similar element may be referenced as 214 in FIG. 2. Elements shown in the various figures herein may be capable of being added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

In the present disclosure, reference is made to the accompanying drawings that form a part hereof, and in which is shown by way of illustration how a number of examples of the disclosure may be practiced. These examples are described in sufficient detail to enable those of ordinary skill in the art to practice the examples of this disclosure, and it is to be understood that other examples may be used and that process, computational, electrical, and/or structural changes may be made without departing from the scope of the disclosure.

The specification examples provide a description of the applications and use of the system and method of the present disclosure. Since many examples may be made without departing from the spirit and scope of the system and method of the present disclosure, this specification sets forth some of the many possible example configurations and implementations.

What is claimed is:

1. A system, comprising:
 a crossbar array, comprising a plurality of memory elements at junctions, usable in performance of computations;
 a calculate engine to calculate ideal conductance of memory elements at a plurality of junctions of the crossbar array;
 a determine engine to determine conductance of the memory elements at the plurality of junctions of the crossbar array; and
 an adjust engine to adjust conductance of at least one memory element to improve computational accuracy by reduction of a difference between the ideal conductance and the determined conductance of the at least one memory element, wherein the adjusting of the conductance of the at least one memory element is based on an input of a number of actual crossbar parameters comprising a number of models of signal output variation in crossbar arrays.

2. The system of claim 1, wherein the at least one memory element is a resistive memory element.

3. The system of claim 1, wherein to adjust the conductance of the least one memory element comprises application of a determined voltage to the least one memory element by the adjust engine to adjust the conductance.

4. The system of claim 1, wherein the system further comprises a compute engine to:
 input an input value;
 direct the input value to the determined memory element, wherein the input value affects conductance of the determined memory element; and
 read an output signal from the determined memory element;
 wherein an adjustment of conductance of the determined memory element improves computational accuracy by the output value being shifted closer to an ideal output calculated by the calculate engine.

5. The system of claim 4, wherein:
 the input value corresponds to a magnitude of an input voltage signal;
 the output value corresponds to a magnitude of an output current signal; and
 the magnitude of the output current signal is affected by the adjustment of the conductance of the determined memory element.

6. A non-transitory computer-readable medium storing instructions executable by a processing resource to:
 calculate ideal conductance of memory elements at a plurality of junctions of a crossbar array;
 determine actual conductance of the memory elements at the plurality of junctions of the crossbar array;
 input a number of actual crossbar parameters to determine an adjustment of the actual conductance of at least one memory element to approximate the ideal conductance of the at least one memory element, wherein the number of actual crossbar parameters comprise a number of models of signal output variation in crossbar arrays; and
 program conductance of the at least one memory element to a higher conductance to improve computational accuracy by reduction of a difference between the ideal conductance and the determined conductance.

7. The medium of claim 6, the instructions further executable to input an input vector pattern to calculate the ideal conductance of memory elements at the plurality of junctions of the crossbar array corresponding to the input vector pattern.

8. The medium of claim 6, the instructions further executable to input a number of ideal crossbar parameters to calculate the ideal conductance of memory elements at the plurality of junctions of the crossbar array.

9. The medium of claim 8, wherein the number of ideal crossbar parameters comprise ON state resistance of the ideal crossbar, OFF state resistance of the ideal crossbar, digital-to-analog converter settings, and analog-to-digital converter settings.

10. A method, comprising:
 calculating ideal conductance of memory elements at junctions of a crossbar array;
 determining conductance of the memory elements at the junctions of the crossbar array;
 adjusting conductance of at least one memory element to reduce a difference between the ideal conductance and the determined conductance of the at least one memory element, wherein the adjusting of the conductance of the at least one memory element is based on an input of a number of actual crossbar parameters comprising a number of models of signal output variation in crossbar arrays; and calibrating the conductance of the crossbar to reduce nonlinearity of signal output for improvement of computational accuracy.

11. The method of claim 10, further comprising:
determining computational accuracy of the crossbar array by how close to being equal to an ideal current output, determined for a corresponding ideal crossbar array, an actual current output is after calibration of the crossbar array.

12. The method of claim 10, wherein calibrating the conductance of the crossbar comprises performing closed-loop voltage pulse tuning of the memory elements.

* * * * *